United States Patent [19]

Perlmutter

[11] Patent Number: 4,876,509
[45] Date of Patent: Oct. 24, 1989

[54] IMAGE RESTORATION PROCESS FOR MAGNETIC RESONANCE IMAGING RESONANCE IMAGING

[75] Inventor: Robert J. Perlmutter, Palo Alto, Calif.

[73] Assignee: Resonex, Inc., Sunnyvale, Calif.

[21] Appl. No.: 116,437

[22] Filed: Nov. 3, 1987

Related U.S. Application Data

[63] Continuation-in-part of Ser. No. 942,604, Dec. 17, 1986, abandoned.

[51] Int. Cl.[4] .......................................... G01R 33/20
[52] U.S. Cl. .................................... 324/309; 324/307
[58] Field of Search ................ 378/99; 358/111, 139, 358/22, 133; 324/300, 307, 309, 313; 128/653

[56] References Cited

U.S. PATENT DOCUMENTS

| | | | |
|---|---|---|---|
| 4,163,249 | 7/1979 | Michael | 358/22 |
| 4,509,011 | 4/1985 | Sugimoto | 324/309 |
| 4,545,384 | 10/1985 | Kawachi | 324/313 |
| 4,549,137 | 10/1985 | Suzzuki | 324/309 |
| 4,579,121 | 4/1986 | Macovski | 324/309 |
| 4,591,789 | 5/1986 | Glover | 324/309 |
| 4,625,171 | 11/1986 | Sekihara | 324/309 |
| 4,684,891 | 8/1987 | Feinberg | 324/309 |
| 4,706,260 | 11/1987 | Fedele | 358/133 |
| 4,724,386 | 2/1988 | Haacke | 324/309 |

OTHER PUBLICATIONS

Medical Physics, 12(1) Jan./Feb. 1985, article entitled "NMR Imaging in the Presence of Magnetic Field Inhomogeneities and Gradient Field Non-Linearaties" by O'Donnell and Edelstein.
Digital Image Processing by William K. Pratt (Wiley & Co., 1978) pp. 113 through 116 enclosed.

*Primary Examiner*—Michael J. Tokar
*Attorney, Agent, or Firm*—Flehr, Hohbach, Test, Albritton & Herbert

[57] ABSTRACT

An improved image restoration technique for an MRI method is provided where after the corrected location of image points is determined, an improved interpolation technique is used in determining the intensity value of that image point utilizing the surrounding pixels, e.g., 4 or 16. The interpolation technique provides for a uniform noise variance by using a weighted average interpolation technique with the added constraint that the sum of the squares of the interpolation weighting functions is substantially equal to a constant. The resulting image may be sharpened by a hybrid convolution technique which separately processes border regions.

16 Claims, 7 Drawing Sheets

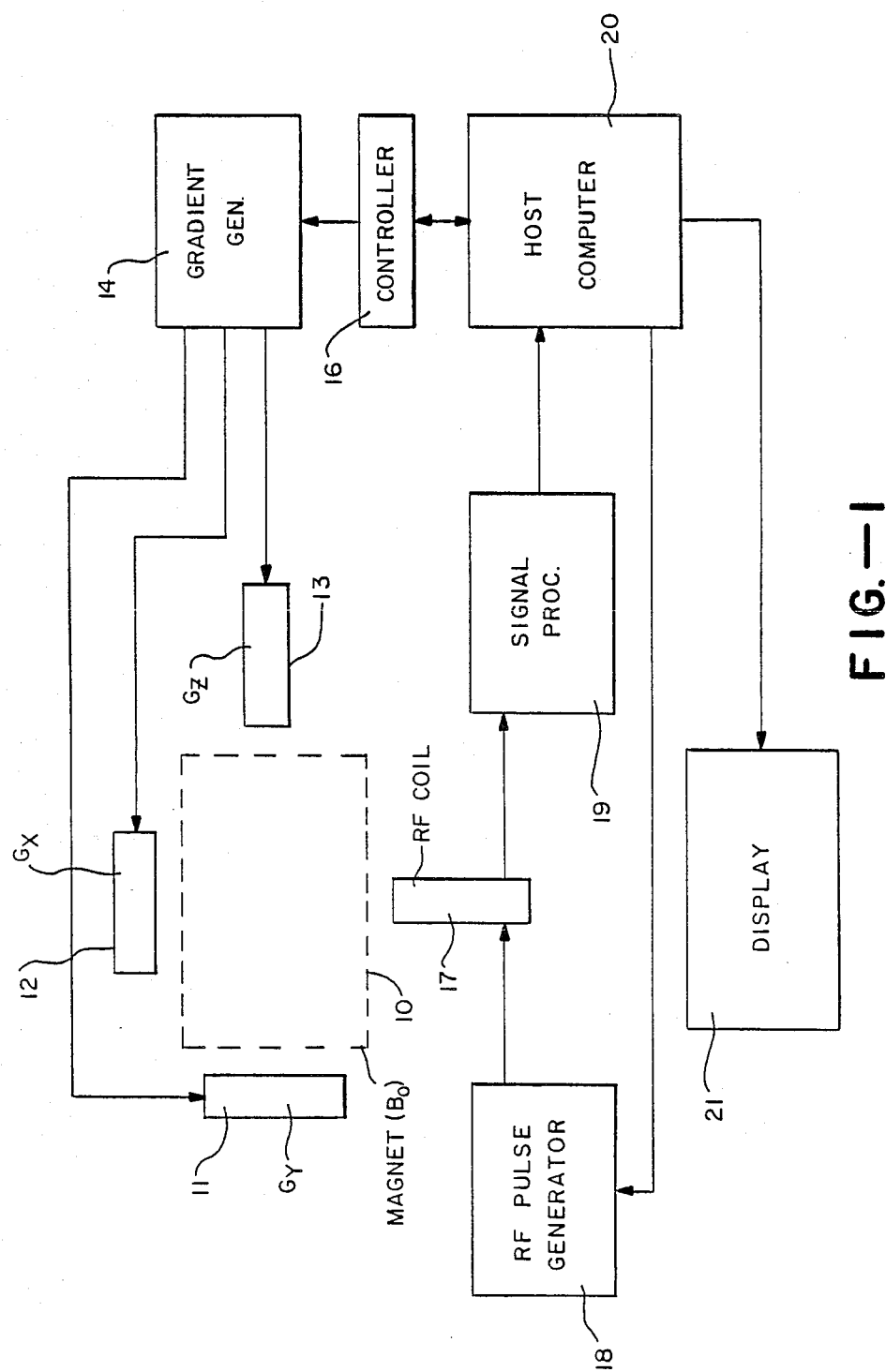
FIG.—1

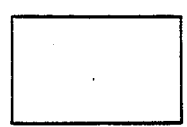 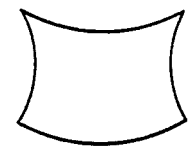
[x, y]  　　　　　　(x', y')
　　　　　　　　　　x' = f(x, y)
　　　　　　　　　　y' = g(x, y)
FIG.—2A　　　　　FIG.—2B
(x'y')
FIG.—3
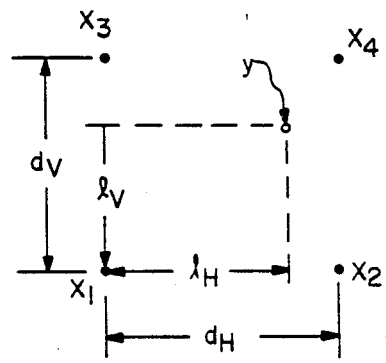
FIG.—4

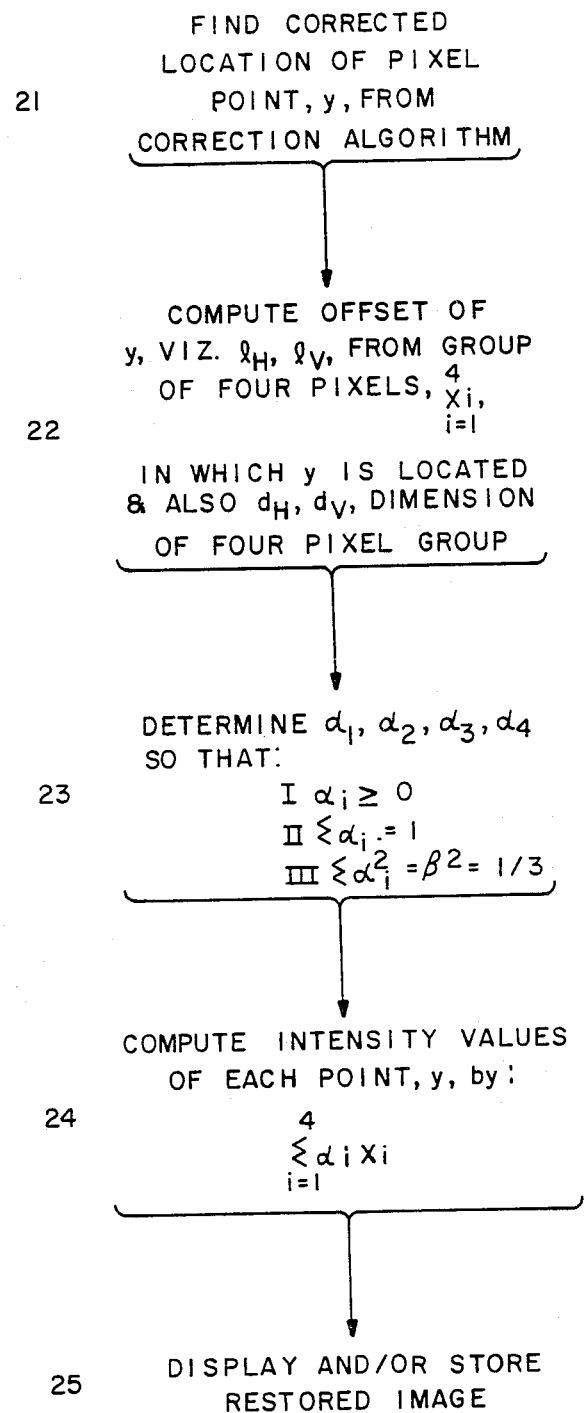
FIG.—5

IMAGE RESTORATION PROCESS FOR MAGNETIC RESONANCE IMAGING RESONANCE IMAGING

This is a Continuation-in-Part of a patent application filed Dec. 17, 1986, in the name of Robert J. Perlmutter entitled "Image Restoration Process for Magnetic Resonance Imaging," and bearing Serial No. 942,604.

FIELD OF THE INVENTION

This invention relates to an image restoration process for correcting the warped or distorted image which is produced during normal reconstruction in a magnetic resonance imaging (MRI) method.

BACKGROUND OF THE INVENTION

In an MRI system the image of a sample or specimen is determined by a static or dc magnetic field and several gradient fields. For example, typical gradient fields will consist of three nominally orthogonal gradient fields known as phase encoding, slice select and readout. Where the static magnetic field is inhomogeneous and the gradient fields nonlinear this results in a geometrically distorted or warped image. Such image is reconstructed from the signals generated by the various gradients typically by a Fourier transform reconstructive technique.

It is known that the above distortions can be corrected by mapping the static magnetic field and the gradient fields. Then a restoration algorithm is applied to correct the distortion and this provide a corrected image. One restoration technique is described in an article in *Medical Physics*, 12(1) Jan./Feb. 1985, entitled "NMR Imaging in the Presence of Magnetic Field Inhomogeneities and Gradient Field Non-Linearities" by O'Donnell and Edelstein. Another similar article is entitled "NMR Imaging For Magnets With Large Non-Uniformities" by Sekihara. et al., *IEEE Transactions On Medical Imaging*, Dec. 1985, Vol. 4, No. 4, pp. 193-199. However, the straightforward application of the reconstruction technique such as that shown in the above *Medical Physics* article may result in an unacceptable image. Specifically, the corrected image may have noise artifacts.

OBJECTS AND SUMMARY OF INVENTION

It is therefore an object of the present invention to provide an improved image restoration process for magnetic resonance imaging.

In accordance with the above object, there is provided an image restoration process for correcting the warped reconstructed image produced by a magnetic resonance imaging (MRI) method where by determining the inhomogeneities of the magnetic field used in the MRI method corrected pixel locations for a corrected image are calculated. Each such pixel location has a known offset, $1_V$, $1_H$, from a group of "n" pixels ($x_1$, $x_2$, $x_3$, ... $x_n$) of the reconstructed warped image, each of the pixels having a known intensity value including a signal portion and a noise portion. The restoration process interpolates the pixel values to determine an intensity value for the corrected pixel location and comprises the following steps. For each corrected pixel location, y, the corresponding intensity value, is computed using $$y = \sum_{i=1}^{n} a_i x_i$$

where $a_i$ is the relative weight to be given each $x_i$ in computing the intensity value of y, by determining $a_1$, $a_2$, $a_3$, ... $a_n$ within the following constraints and taking into account the offset:

$$a_i \geq 0 \quad i = 1, 2, 3, \ldots n \qquad \text{I.}$$

$$\sum_{i=1}^{n} a_i = 1 \qquad \text{II.}$$

$$\sum_{i=1}^{n} a_i^2 = \beta^2 < 1 \qquad \text{III.}$$

where $\beta^2$ is substantially a constant and whereby noise variance of the noise portion is uniform for each corrected pixel location and is independent of location of each pixel within the group of pixels. There is displayed and stored the computed intensity values for each corrected pixel location to provide the restored image.

BRIEF DESCRIPTION OF THE DRAWINGS

FIG. 1 is a block diagram of an MRI system embodying the present invention.

FIGS. 2A and 2B are sketches indicating the method of the present invention.

FIG. 3 is a more detailed sketch of pixel locations showing the method of the present invention.

FIG. 4 is a sketch of a single corrected pixel location demonstrating the method of the present invention.

FIG. 5 is a flow chart embodying the method of the present invention.

DETAILED DESCRIPTION OF THE PREFERRED EMBODIMENTS

Figure 6:
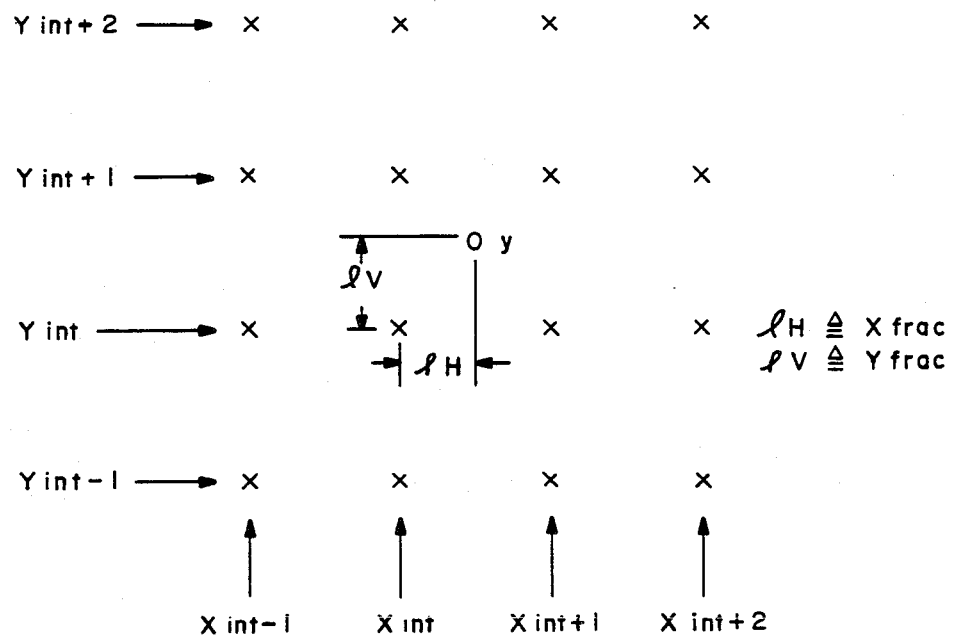
FIG. 6 is a sketch of pixel locations showing an alternative embodiment of FIGS. 3 and 4.

FIG. 1 illustrates a magnetic resonance imaging (MRI) system which in its block diagram form is of a standard type. However, with the process of the present invention, it is possible to utilize the improved method.

Referring specifically to FIG. 1, the main magnet 10 provides a magnetic field $B_0$ which generates a steady magnetic field realizing a polarization of the nuclei of the sample or subject for which an image is desired. Thus, within magnet 10 there is a cavity or space in which the specimen or human to be examined is placed.

The apparatus also includes a gradient system utilized for producing spatial linear field gradients. These gradient fields are conveniently established by a set of three orthogonal direct current coils 11, 12 and 13 which generate the three principle gradients $G_x$, $G_y$ and $G_z$. These coils are driven by gradient generator 14, which in turn is controlled by a controller 16 which communicates with a host computer 20.

Finally, the third component of the typical MRI system includes the radio frequency (RF) coil 17, which generates radio frequency fields in the subject being analyzed and picks up a free induction decay or spin-echo signal which is generated after termination of the radio frequency pulse. For exciting RF coil 17 there is RF pulse unit 18.

The signal processor 19 receives the small micro voltage level spin-echo signals generated by the subject and these are processed by computer 20 and reconstructed, to form an image. This is accomplished typically by a Fourier transform technique well known in the art. Generally, the image is digitized in an analog-to-digital converter and stored in the memory section of computer 20 for later display by means of a display 21 which may typically be a cathode ray tube. The reconstructed image on the cathode ray tube has a resolution determined by the number of pixels (for example, 128 or 256) across each horizontal scan line of the CRT.

The distortion or warping of an image due to inhomogeneities in both the static magnetic field and gradient fields is illustrated by the idealized rectangular image of FIG. 2A and the distorted image of FIG. 2B. Thus, FIG. 2A may be described by x,y coordinates and FIG. 2B by x',y' coordinates. More generally, the coordinates or the distortion are characterized by the equations $x'=f(x,y)$ and $y'=g(x,y)$. These two functions in the case of magnetic resonance imaging are determined by mapping the static magnetic field and the gradient fields. (For example, this might be done by a robot carrying a sensor and perhaps 1000 to 2000 points would be mapped.) The relationship between the magnetic fields and the functions $f$ and $g$ are well known as, for example, illustrated in the foregoing *Medical Physics* article.

In general terms the standard image reconstruction process (for example, which is accomplished most typically by a Fourier transform technique) yields a warped or distorted image as illustrated in FIG. 2B. Then a restoration process described in the *Medical Physics* article undoes or reverses this distortion. As illustrated in FIG. 3 which is, for example, a small portion of the warped image in FIG. 2B, the x,s indicate the locations in the x',y' or warped coordinate system of the reconstructed warped image. This is thus a two-dimensional array or grid of pixels with each pixel having a certain location x',y' and an intensity value. Such intensity values include, as with most signals, a signal portion and a noise portion. The intensity is actually, for example, the gray level of a cathode ray tube display. In accordance with the standard restoration process in order to restore the image there must be evaluated the intensity values of the warped image on an irregularly spaced set of points denoted by the zeros in FIG. 3. More specifically, the location of the zeros relative to the x's in FIG. 3 must be computed. Then the intensity value of a computed zero-type pixel must be computed. The above problem can be reduced to its most simple aspects by reference to FIG. 4 where a group of four pixels $x_1$, $x_2$, $x_3$ and $x_4$ which are related to the x-type points of FIG. 3 surround or contain in a square type box as illustrated in FIG. 4 a point 0 (corresponding to one of the "0" type points of FIG. 3) denoted with the letter y. Thus, the pixel location y is located within the four pixel group by an offset from the point $x_1$ designated $1_H$ and $1_V$. And furthermore $d_V$ and $d_H$ are the two dimensions of the rectangular type group of four pixels generally described as $X_i$. As described above, the determination of the location of point y in FIG. 4 is well known as shown by the *Medical Physics* article. More specifically, as shown by the equations pages following the main part of the present specification, Equation 4 is taken directly from that article and is a correction algorithm where the A'(u,y) term is the corrected image location.

Thus, u and y would correspond to x',y' in the present notation. The portion of Equation 4 relating to the quantity A is evaluated by $\beta u$ and $\beta v$ which are the magnetic field inhomogeneities and the non-linear gradients. As discussed above these were determined by a physical field mapping of the apparatus itself. Then the K factors are generalized intensity corrections. In any case, Equation 4 determines the $X_i$ pixel group location, provides a determination of the $1_V$, $1_H$ offset, and then also provides the intensity values of the four pixel or $X_i$ group. Finally, by use of the K values it suggests the determination or more broadly the interpolation required to compute the y intensity value.

There are at least two known approaches to interpolating the intensity values of the four x pixel locations to determine the y intensity value. The first and simplest approach is called "nearest neighbor" interpolation. In this scheme the value assigned to the image at y is simply that of the $X_i$ pixel nearest to it. In FIG. 4 this would be $x_4$. The problem with this technique is that the ultimate resolution of the restored image is affected because the edges of the image become jagged or broken. Another approach is known as bilinear interpolation. In this method, the pixel value for 0 is computed as the weighted average of the pixel values of its four nearest neighbors. This type of bilinear interpolation is described in a textbook by William K. Pratt entitled *Digital Image Processing*, page 432, Wiley & Co., 1978. It can be expressed in general terms as illustrated by Equation 5, where the intensity value of pixel location y is determined by the sum of the weighted average indicated by the weighting function $\alpha_i$ times the corresponding $x_i$ where i varies again from 1 to 4. To compute the various $\alpha$ values, reference may be made to Equations 6 through 9 where the offset values $1_V$, $1_H$ and the size of the $x_i$ pixel grouping $d_V$, $d_H$ all as illustrated in FIG. 4 are utilized in a straight mathematical manner. However, it should be emphasized that this technique of bilinear interpolation would not include the additional factors shown in Equations 6 through 9 of the $\gamma_0$ and the $\gamma_1$.

The use of bilinear interpolation results in acceptable edge continuity (in contrast to nearest neighbor interpolation) but results in unacceptable noise streaks or artifacts in the restored image. Thus, this is the reason for the modification of the weighting Equations 6, 7, 8 and 9 with the additional $\gamma$ factors which will be explained below.

In order to better understand the problem solved by the method of the present invention, the underlying concepts of bilinear interpolation and in fact, any interpolation scheme, must be better understood. These inherent characteristics are illustrated by Equations 1 and 2 shown on the equations page following the main part of this specification. In Equation 1 it is stated that the weighted functions must be non-negative. This implies or insures that the interpolation is a kind of averaging as opposed to differentiating which will require a negative value. The second equation states that the sum of all the weighting values must equal 1. Thus, this is effectively taking a weighted average of the four points so that the mean value is not distorted. Therefore, it is apparent that Equations 1 and 2 apply to all interpolations.

As discussed above, the intensity values of each image include both the signal portion plus uniformly distributed random noise. This noise is more accurately described as identical but independently distributed (IID) noise. That is, the noise distribution pixel to pixel is identical. Thus there is zero mean noise with the same standard deviation from pixel to pixel. If, by using bilinear interpolation, a point is evaluated in the middle of the four $x_i$ pixels, there will be a reduction in noise for the newly computed or corrected pixel locations. This is because in determining noise variance the sum of the squares of the weights is taken. Thus assuming a pixel located exactly in the middle of, for example, the square of FIG. 4 this means each weighting function would have an equal value of $\frac{1}{4}$ in effect producing a resulting value of noise which was $\frac{1}{4}$ of the original noise value of the surrounding $x_i$ pixel locations. This is all due to the averaging in the interpolation step. In addition, it is because the noise is identical but independently distributed.

On the other hand, when the corrected point y falls directly on an original image point, for example $x_4$ (see FIG. 4) its value as far as noise will simply be that of the original point. In other words, it will contain the same noise power. What this means is that when bilinear interpolation is used some portions of the corrected or restored image will be as noisy as the original image and other portions will be less noisy. This is thus the source of noise artifacts or noise streaks that make bilinear (or any higher order) interpolation scheme unacceptable.

Thus, the object of the present invention is to provide a uniform noise variance interpolation. And as discussed above mathematically, the noise streaks produced by the bilinear interpolation method can be explained by the fact that the noise variance at each location in the corrected restored image depends upon the pixel location relative to the pixel grid in the distorted image as illustrated in FIG. 3. This problem can be solved by introducing in addition to the constraints of Equations 1 and 2, a third constraint to the $\alpha_i$ or weighting functions. This is illustrated by Equation 3 on the equations page, that the sum of the squares of the $\alpha$ weighting functions is equal to a constant $\beta^2$ which is less than 1. With this constraint, the noise variance in the corrected image will be $\beta^2$ times that of the distorted or uncorrected image. Thus, noise streaks cannot occur since the variance will be uniform across the entire image.

Equation 3, that is the sum of the squares of the interpolation weighting functions must be equal to a constant $\beta^2$ can be shown to be true by the following simplified proof. As shown by Equation 10, the variance of any quantity is defined in fact, by the expected value of the square of the difference between the random variation and its mean. Thus as defined in Equation 10, the random value (which is in essence the signal plus the noise of the pixel) is defined as y and its mean with the bar value. Expanding Equation 10 yields an expansion of the y term to the weighted sums of the pixel values (actually an expansion of Equation 5) and the bar value of y or its mean is the signal portion, $S_i$, plus the mean of the noise which is $\mu_n$. And of course, since this is a identically distributed type noise, $\mu_n$ is actually $\mu_1$ or a constant. When Equation 11 is expanded and all of the non-random portions cancel out including cross terms, Equation 12 results. This equation just involves the square of the $\alpha$ type weights, the variance, $\sigma_n^2$, of the noise in each of the original pixels and the mean of the noise $\mu_n$. To maintain this value constant the sum of the weighted $\alpha^2$ must be the constant $\beta^2$ as shown in Equation 13. Of course, Equation 13 is identical but in a different format to Equation 3, the third constraint. In general, Equation 11 results in Equation 12 because of the IID type noise which means that all of the cross terms that consist of terms which include the noise from one pixel times the noise from another pixel, their expected values will also be zero because that is one of the components of the definition of IID noise. The fact that the noise is independent means that the expected value of the product of the noise from one pixel times another is zero. The other factor is that the expected value of the signal portion of the pixel is exactly the signal itself.

In order to satisfy the constraints of Equations 1, 2 and 3 it is useful to consider a equivalent geometrical picture. With such a picture the final equations for the weighting factors $\alpha$ as defined in Equations 6, 7, 8 and 9 along with the $\gamma$ factors can best be understood. Because of the four weights it is necessary to consider a four dimensional space. However, since in a four dimensional space, the hyperplane is of three dimensions, the geometrical picture that can be utilized is that of a sphere within a tetrahedron. Moreover, as will be discussed below, the sphere or ball ideally will just barely fill the tetrahedron so its surface is tangent with the faces of the tetrahedron.

With regard to Equation 1 and the non-negative condition, the ball must lie inside the tetrahedron. The $\alpha$ points or weighting functions are defined by points lying on the surface of the ball. Moreover, these are based upon the position of the point which is dependent upon the offset $1_H$ and $1_V$ (see FIG. 4). When a specific location using the offset coordinates are found, that location will map into a specific point inside the tetrahedron which, generally speaking, will not lie onto the surface of the ball. This latter condition is necessary to satisfy the three constraints. The next step is to find a point on the ball which is suitably close to the point as defined by the offset coordinates. Thus the preferred technique of the present invention (there are believed to be others) is to utilize the conditions set out in Equations 6 through 9. The original parts of Equations 6 through 9 without the $\gamma$ terms, that is $\gamma_0$ and $\gamma_1$, were the same as the weights for bilinear interpolation. These, in fact, determine the location of the point that lies within the tetrahedron (in our geometrical theoretical example) to find the nearest point to that point that lies on the ball. Thus, it resolves into the general problem of finding a point on a sphere that is near some point not on it. This can be solved by simply dropping a line connecting the center of the ball to a point not on the ball and then extending it through to where it intersects the ball. Thus, the problem is one solved by taking a ratio of two radii. Thus, the term $\gamma_0$ as defined in Equation 9 has as its numerator the radius of the sphere which is $\beta^2 - \frac{1}{4}$ *and the denominator is an expression with a distance of this point as determined by the offset from the center of the ball. It is in effect a sum of the squares of three terms because the ball lies in a three dimensional space. Next, the $\gamma_1$* term is in effect an additive term which relates to the distance that the theoretical hyperplane is from the origin of the sphere.

Finally, as shown in the definitions of the terms of Equation 9 and the 7 terms, it has been found that $\beta^2$ should be greater than $\frac{1}{4}$ and equal to or less than $\frac{1}{3}$. Relating to the foregoing geometrical analogy (which is a very theoretical analogy) if $\beta^2$ is actually equal to $\frac{1}{4}$, this implies that the sphere has turned into a dot. This is the same as if an average of the four surrounding pixels $x_i$ were the mathematical average always taken. This results in an unsatisfactory and erroneous image. On the other hand, if $\beta^2$ is equal to 1, this is in effect the nearest neighbor interpolation technique which produces broken or ragged edges. Finally, if $\beta^2$ is greater than $\frac{1}{3}$ this in effect is utilizing points outside of the tetrahedron which will produce ragged edges. Still speaking of the geometrical analogy if a $\beta^2$ exactly equal to $\frac{1}{3}$ is utilized, this is believed to optimize the corrected image where continuity of the edges is preserved and the signal to noise ratio is reasonable. And the geometrical interpretation of this value is where the sphere exactly tangent to the walls of the tetrahedron.

FIG. 5 summarizes the method of the present invention in a convenient format. In the first step 21 the corrected location of the pixel point y is determined from the standard correction algorithm as for example, illustrated by the *Medical Physics* article. In step 22 the offset $1_H$, $1_V$ from the typical group of four pixels $x_i$, and also the dimension of the pixel group, $D_H$, $d_V$ is computed and stored. With the foregoing information, the weighted "alphas" are determined in step 23 with the three constraints in mind by use of specifically the equations in the preferred embodiments, Equations 6 through 9. The intensity value of each point is computed by the use of Equation 5 as shown in step 24. Finally, the data points are either displayed with the proper intensity and/or stored as shown in step 25. While the foregoing technique and the specific embodiment utilizing a group of four pixels for interpolation or a 2×2 group of pixels is satisfactory for image quality, larger groups of pixels may of course be utilized. Thus in Equations 1, 2, 3 and 5 the maximum value of the "i" term may be referenced merely as "n". Thus, in Equation 1 "i" may be equal to "1, 2, 3, ..., n". One advantage of the use of a larger group of neighboring pixels for interpolation is that the edges of the final restored image may be smoother (less jagged) which provides at least in one respect a better overall image.

It should be kept in mind that when a larger group of pixels is used for interpolation that the constraints of Equations 1, 2 and 3 must still be adhered to. Keeping these constraints in mind it has been found that if a pixel group of 16 pixels (that is 4×4) is used for interpolation as illustrated in FIG. 6, a less jagged, smoother edge results. And specifically referring to FIG. 6 the y designates a pixel location of interest for which its intensity value must be computed. With the use of a 4×4 matrix the x-coordinate matrix of pixels are designated in the manner shown as $x_{int}$ with various integer additions and subtractions and the vertical coordinates are similarly designated as $y_{int}$ etc. Then the offset distance from the $x_{int}, y_{int}$ point are designated in a manner similar to FIG. 4, that is $L_V$ and $L_H$. As also shown in FIG. 6 the offset distances are also known as corresponding fractional distances and thus are defined as Xfrac and Yfrac. The y-coordinate should of course be distinguished from the "y" which is used for the point to be evaluated by interpolation of the neighboring 16 points.

As discussed above when 16 points are used the interpolation algorithm must conform to the restraints of Equations 1, 2 and 3. It has been discovered that one interpolation algorithm which conforms to the restraints is known as the cubic B spline algorithm. The alpha ($\alpha$) type weights used in this algorithm are illustrated in the Table 1. Here the x is defined as Xfrac. It should be noted that the cubic B spline algorithm per se is known as for example as is discussed in the Pratt textbook referenced above. However its application to this type of image restoration where the constraints of Equations 1, 2 and 3 must be obeyed so that undesired artifacts will not be generated was not known. In other words, noise streaks are avoided since a uniform noise variance across the entire image is provided.

With the use of the cubic B spline interpolation algorithm as discussed above and referring to Equation 3 the beta factor is maintained substantially constant. As discussed in the Pratt book the beta should be between 0.46 and 0.50. With regard to the Pratt textbook it should be emphasized that the image sharpening cubic B spline algorithm was not recognized that it would have an unexpected application to the MRI field where it is necessary to avoid noise artifacts.

Figure 8:
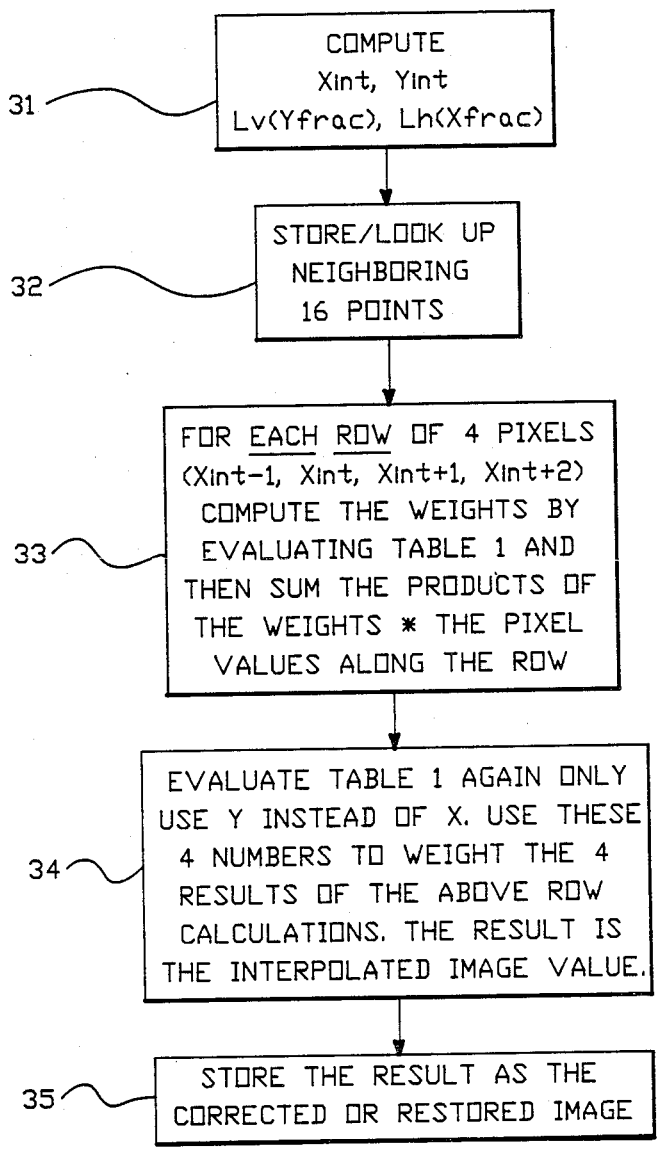
FIGS. 8, 9, and 10 are flow charts 1,2,3, respectively, which are useful in understanding the invention.

Flow Chart 1 (FIG. 8) illustrates the specific technique of the cubic B spline interpolation which is somewhat analogous to the interpolation of FIG. 5. Thus in step 31 by well known correction algorithms as already defined above for example in the case of Equation 4 the pixel point, y, is located in the 4×4 matrix, the $x_{int}$ and $y_{int}$ found and the offsets $1_V$ and $1_H$ are computed. Then the intensity values of the neighboring 16 points are stored for later lookup use as set out in step 32. It should be emphasized at this point that although one embodiment shows 4 points and another 16 points that other numbers of neighboring points may be used with the constraints of Equations 1, 2 and 3. Continuing with the Flow Chart 1 in step 33 an interpolation is made for each row in the x direction. This is done with the aid of the weights of Table 1 and then the sum of the products of the weights and the pixel values are taken along each row. Then, as illustrated in step 34 the Table 1 is used for the vertical y offset. The resulting four values of the x row can be weighted by the new sets of four weights of the y row and summed to produce the final value. Thus the intensity value is computed in a generalized manner by the same Equation 5 as shown in step 24 of FIG. 5. Lastly, the results of the corrected or restored image are stored in step 35.

Figure 10:
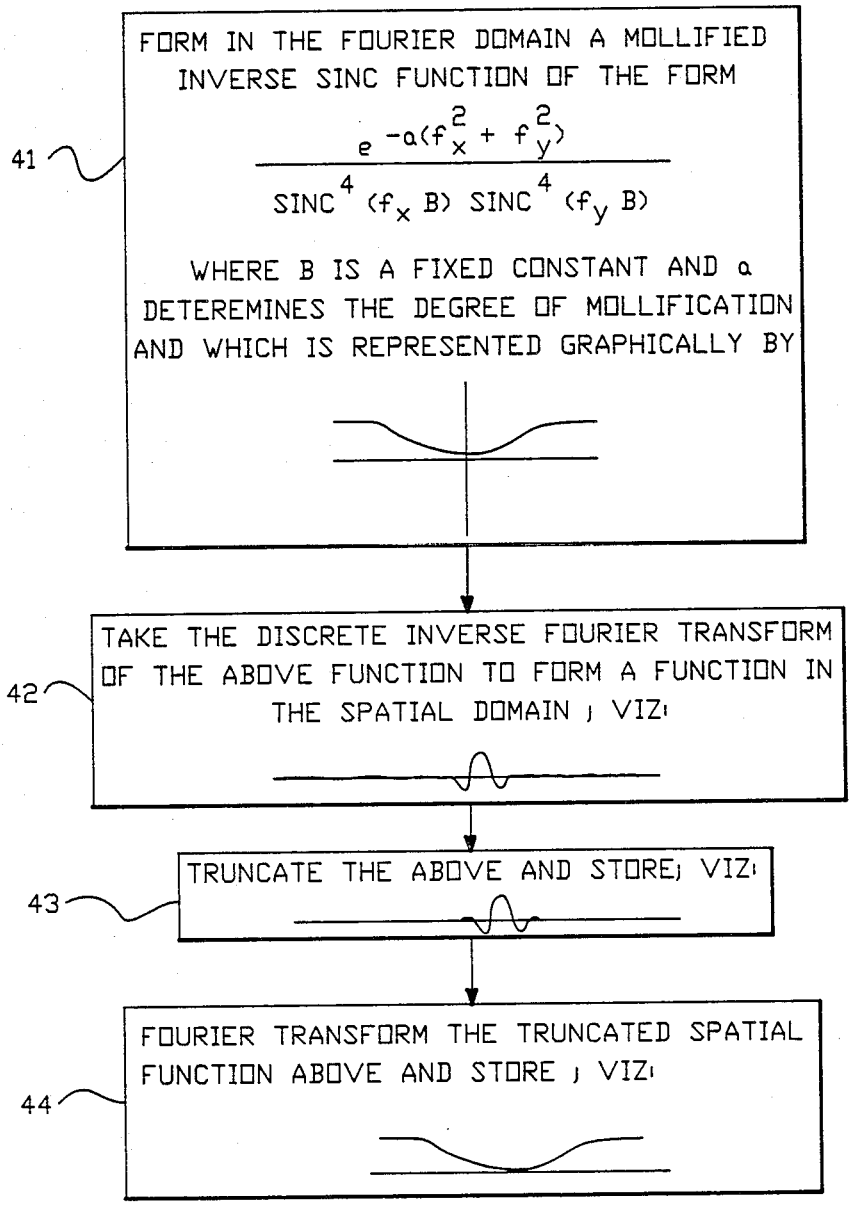

The foregoing provides an improved image with respect to the less jagged edges per se. However, due to the use of 16 neighboring points the overall image may be somewhat blurry. In accordance with the present invention this can be corrected by a specific image sharpening technique. It has been discovered that by the inherent nature of the cubic B spline interpolation technique that this type of blurring can be eliminated or rather the image sharpened by the use of an inverse SINC function. And such a function is shown in Flow Chart 3 (FIG. 10) in step 41 and it is of the $SINC^4$ type. It should parenthetically be noted that theoretically sharpening of the 2×2 matrix utilized in the embodiment of FIGS. 2 and 3 can also be sharpened by an inverse $SINC^2$ function but this is not believed to be necessary. Moreover, it is believed that other side effects may not warrant such filtering. But it is still theoretically possible.

Figure 7:
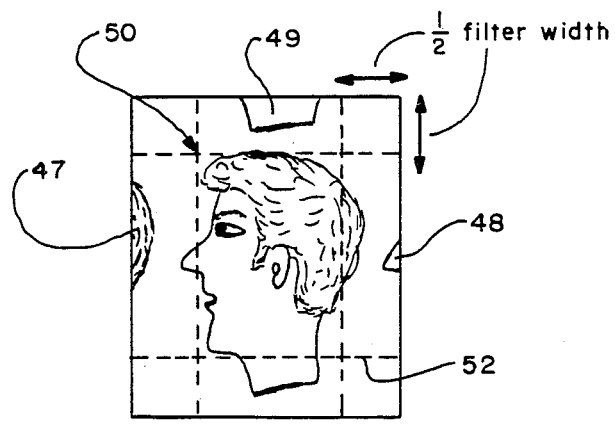
FIG. 7 shows an intermediate image formed in the above alternative embodiment.

Referring specifically to the image sharpening technique in Flow Chart 3 which is referred to as an image sharpening filter, the inverse SINC function in step 41 should also be a mollified or smoothed function (as illustrated) as provided by the "alpha" term which determines the degree of mollification. It has been found that if the inverse SINC function is not mollified, an artifact in the form of a checkerboard may result if the image is sharpened merely by the use of an inverse SINC function only. Thus mollification must be accomplished. The specific value of alpha depends for example in a magnetic resonance imaging situation on the body part, namely, head or torso, being examined. For a head portion which involves a less noisy image, an alpha for example of 0.086 may be used; for a torso portion where perhaps more noise is present a larger alpha of .12 might be used. The fixed constant "B" (which is different from "beta") is defined in the Pratt book and depends on the pixel to pixel spacing, $d_v$, $d_h$, of the image as illustrated in FIG. 4. This fixed constant is therefore precalculated. Since the function shown in step 41 is in the Fourier domain, step 42 converts it to a spatial domain as illustrated. The purpose of this is to truncate it as shown in step 43. Truncation is necessary to provide an effective filter which is somewhat smaller than the image of the actual specimen. That is, the extent of the filter should fall within for example the head cross section or torso cross section rather than extending into the "black" non-image portion of the image field. This, besides avoiding noise, reduces the time of computation. And then as will be discussed below it avoids filtering the border regions. The border regions have unwanted artifacts which will be treated in a different manner as to be discussed below. Lastly, in step 44 the truncated spatial function is Fourier transformed to the function shown to be used in a later Fourier convolution technique. Both the Fourier and spatial domain truncated function are stored for later use. The above computations of Flow Chart 3 are actually usually done at the "factory site" and stored in computer storage in association with, for example, host computer 20 as illustrated in FIG. 1. To adjust the mollification factor alpha as in step 41, more than one type of image sharpening filter may be provided to allow a choice depending on the specimen. Alternatively, for larger installations, all of the steps of Flow Chart 3 can be done at the user's site. As already discussed, the cubic B spline interpolation corrects the image but may blur the image somewhat. To sharpen the image the image sharpening filter in the form of an inverse SINC function, as outlined in Flow Chart 3, must be utilized. Either the spatial function 43 or the Fourier transform function 44 theoretically can be directly utilized to perform this image sharpening function. In the spatial domain, as illustrated in step 43 of Flow Chart 3, if a serial convolution is utilized, which is a linear or zero padded non-Fourier type convolution (and this is taught in the Pratt textbook), a very long processing time is required. This is unacceptable in an MRI system where several successive images are required in a rapid sequence. Thus, a standard serial convolution cannot be utilized (that is, one in the spatial domain). On the other hand, theoretically a fast convolution algorithm using fast Fourier transforms, which can be termed a periodic or circular convolution, satisfies the time requirement but treats the image as if it were periodic in both X and Y dimensions. Thus, the resulting sharpened image suffers from an artifact that the left and right sides of the images (as well as the top and bottom) "wrap around." FIG. 7 illustrates this effect where the cross-section of a head 46 of a person is illustrated with a wrap around occurring both on the vertical and horizontal axis. Specifically, there is shown in the horizontal axis artifacts of the back portion of the head 47 and the nose 48. Then in the vertical axis there is the neck 49. To eliminate this wrap around effect or artifact it has been suggested in the literature to embed the image and filter in an array of zeros which contains 4 times the number of points as the original image. This is too time consuming.

Figure 9:
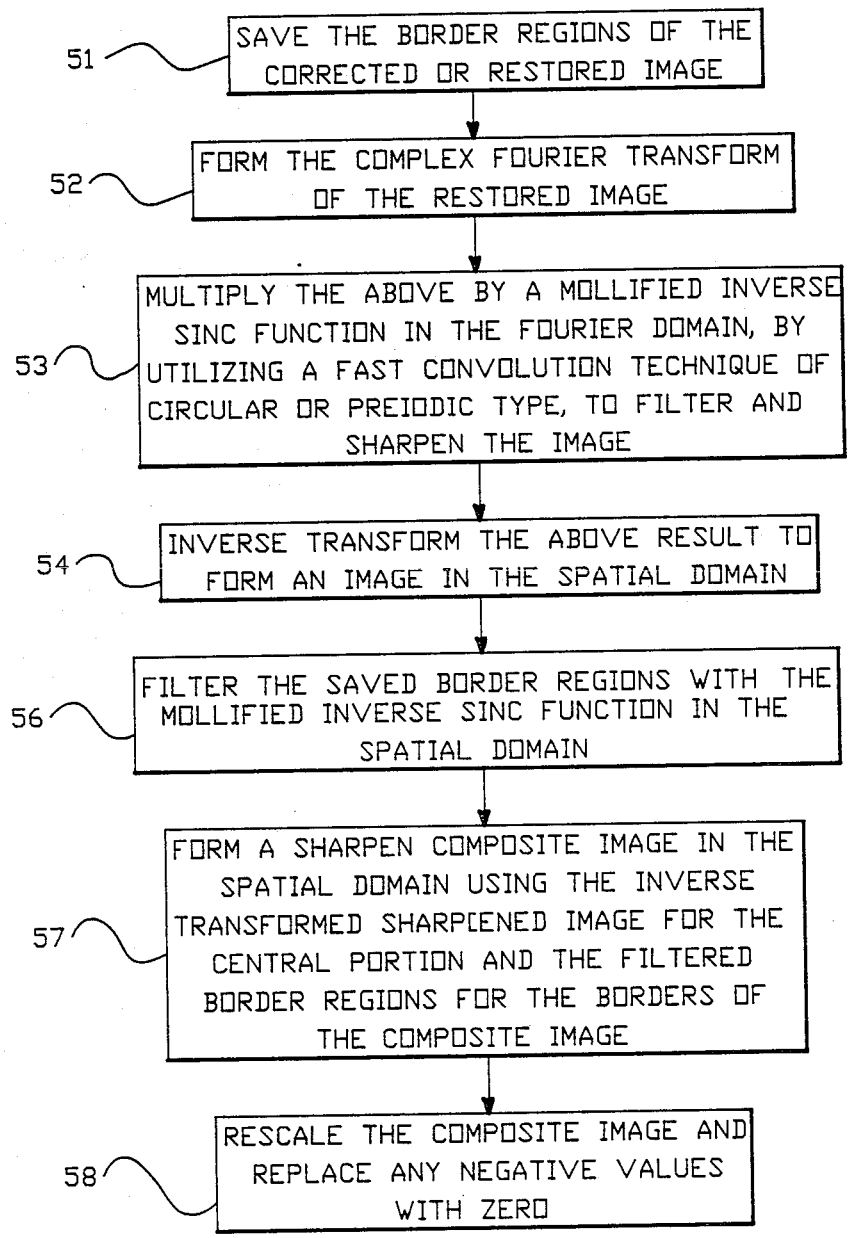

In accordance with the present invention, the image sharpening filter process is done by using a hybrid convolution technique which greatly reduces the number of computations and therefore the time for processing. Flow Chart 2 (FIG. 9) illustrates such technique. As shown in step 51 the border regions of the corrected or restored image are saved. Such border regions are illustrated by the dashed lines 52 in both the horizontal and vertical directions in FIG. 7. As illustrated in Flow Chart 2, the following overall sequence of steps are utilized to form the final sharpened image. The restored image of Flow Chart 1, as illustrated in step 51, has its border regions saved. In other words, those regions outlined by the borders indicated at 52. However, at this point there would be no wrap around artifact. Next, in step 52 the image is reconverted back to the Fourier domain.

In step 53 the Fourier domain overall image is multiplied by the SINC function 44 shown in Flow Chart 3, which has been, of course, truncated, and a fast convolution technique well known in the art of the circular or periodic type sharpens the image. Then this image is converted back to the spatial domain, as set out in step 54 to provide the image shown in FIG. 7. The border regions are optimally ½ filter width so that the truncation of the filter in effect has operated only on the central portion shown by the block 50. Thus, already some wrap around has been avoided.

Next, as illustrated in step 56 (referring to Flow Chart 2), the saved border regions are filtered with the SINC function of step 43 of Flow Chart 3 which is the mollified inverse SINC function in the spatial domain. This filtering, of course, must be accomplished by a serial convolution technique which inherently takes a longer period of time; however, since it is done only at the border regions, the time is not excessive. And this filtered border region will, of course, contain no wrap around artifacts since, as discussed above, these are only caused by the use of a Fourier transform circular type convolution.

Next, in step 57, the sharpened composite image is formed in the spatial domain by utilizing the inverse transform sharpened image for the central portion of the image and the filtered border regions (done by the serial convolution technique) for the borders of the composite image. Lastly, in step 58 the composite image is rescaled (to bring it back to a uniform size) and even negative values are replaced with zero. Such negative values may inherently occur during the image sharpening process, which may cause some negative image values which, of course, theoretically cannot be displayed and in any case, are unwanted artifacts. Thus, a final image is provided as, for example, illustrated in FIG. 7 but without the artifacts. Furthermore, the image quality with the use of a 16 neighboring pixels is after sharpening, believed to be superior to the use of 4 neighboring pixels. And lastly, computation time is reduced for the sharpening filter process in using the hybrid convolution technique.

With regard to noise variance as discussed above, noise variance must not vary in a visible way as a result of the correction process. Using the cubic spline interpolation, the noise variance will vary over an 8% range from the 0.46 to 0.50 values. This will still provide an image which does not have the visible artifacts known as "noise streaks." Furthermore, with the use of the 16 point technique, the edges of the image are smoother (less jagged). Finally, by adjustment of the Gaussian damping factor designated the "alpha" factor of Flow Chart 3, step 41, the signal to noise ratio may be improved as much as 10% without visible blurring of the image.

Thus, an improved image restoration process for MRI has been provided.

EQUATIONS $$\alpha_i \geq 0 \quad i = 1, 2, 3, 4 \quad (1)$$

$$\sum_{i=1}^{4} \alpha_i = 1 \quad (2)$$

$$\sum_{i=1}^{4} \alpha_i^2 = \beta^2 < 1 \quad (3)$$

$$A'(u,v) = K_u(u,v)K_v(u,v) \quad (4)$$
$$*A[u - \beta_u(u,v), v - \beta_v(u,v)]$$

$$y = \sum_{i=1}^{4} \alpha_i x_i \quad (5)$$

$$\quad (6)$$
$$\alpha_1 = \left(\frac{d_H - l_H}{d_H}\right) \cdot \left(\frac{d_V - l_V}{d_V}\right) \gamma_0 - \gamma_1$$

$$\alpha_2 = \frac{l_H}{d_H} \frac{d_V - l_V}{d_V} \gamma_0 - \gamma_1 \quad (7)$$

$$\alpha_3 = \left(\frac{d_H - l_H}{d_H}\right) \cdot \frac{l_V}{d_V} \gamma_0 - \gamma_1 \quad (8)$$

$$\alpha_4 = \frac{l_H}{d_H} \frac{l_V}{d_V} \gamma_0 - \gamma_1 \quad (9)$$

where:

$$\gamma_0 = \left\{ (\beta^2 \cdot \tfrac{1}{4}) / \left[ \left(\frac{l_H}{d_H} \cdot \tfrac{1}{2}\right)^2 + \right. \right.$$
$$\left. \left. \left(\frac{l_V}{d_V} \cdot \tfrac{1}{2}\right)^2 + 4\left(\frac{l_H}{d_H} \cdot \tfrac{1}{2}\right)^2 \left(\frac{l_V}{d_V} \cdot \tfrac{1}{2}\right)^2 \right] \right\}^{\tfrac{1}{2}}$$

$$\gamma_1 = \tfrac{1}{4}(\gamma_0 \cdot 1), \tfrac{1}{2} \geq \beta^2 > \tfrac{1}{4}$$

$$\text{VARIANCE} \equiv E\{(y \cdot \bar{y})^2\} \quad (10)$$

$$= E\{(\alpha_1 x_1 + \alpha_2 x_2 + \alpha_3 x_3 + \alpha_4 x_4)^2\} \quad (11)$$

$$\cdot (\alpha_1(s_1 + \mu_N) + \alpha_2(s_2 + \mu_N) + \ldots)^2$$

$$= (\alpha_1^2 + \alpha_2^2 + \alpha_3^2 + \alpha_4^2)(\sigma_N^2 \cdot \mu_N^2) \quad (12)$$

FOR UNIFORM NOISE VARIANCE (13)

$$\alpha_1^2 + \alpha_2^2 + \alpha_3^2 + \alpha_4^2 = \beta^2$$

TABLE I

| Location | (cubic B spline) Weight Formula, X TM Xfrac |
|---|---|
| Xint + 2 | $X^3/6$ |
| Xint + 1 | $-.5X^3 + .5X^2 + .5X + 1/6$ |
| Xint | $.5* X^3 - X^2 + \tfrac{2}{3}$ |
| Xint - 1 | $-1/6* X^3 + .5* X^2 - .5* X + 1/6$ |

What is claimed is:

1. An image restoration process for correcting the warped reconstructed image produced by a magnetic resonance imaging (MRI) method where by determining the inhomogeneities of the magnetic field used in the MRI method corrected pixel locations for a corrected image are calculated, each such pixel location having a known offset, $1_V$, $1_H$, from a group of four pixels ($x_1$, $x_2$, $x_3$, $x_4$) of the reconstructed warped image each of said four pixels having a known intensity value including a signal portion and a noise portion, said restoration process interpolating said four values to determine an intensity value for said corrected pixel location comprising the following steps:

for each corrected pixel location, y, computing the corresponding intensity value using $$y = \sum_{i=1}^{4} \alpha_i x_i$$

where $\alpha_i$ is the relative weight to be given each $x_i$ in computing said intensity value of y, by determining $\alpha_1$, $\alpha_2$, $\alpha_3$, $\alpha_4$ within the following constraints and taking into account said offset:

$$\alpha_i \geq 0 \quad i = 1, 2, 3, 4 \quad \text{I.}$$

$$\sum_{i=1}^{4} \alpha_i = 1 \quad \text{II.}$$

$$\sum_{i=1}^{4} \alpha_i^2 = \beta^2 < 1 \quad \text{III.}$$

where $\beta^2$ is a constant and whereby noise variance of said noise portion is uniform for each corrected pixel location and is independent of location of each pixel within said group of four pixels;

and displaying or storing said computed intensity values for each corrected pixel location to provide a said restored image.

2. A process as in claim 1 where $\beta^2$ is greater than $\tfrac{1}{4}$ and equal to or less than $\tfrac{1}{3}$.

3. A process as in claim 1 where $\beta^2$ is substantially equal to $\tfrac{1}{3}$.

4. A process as in claim 1 where $\alpha_1$, $\alpha_2$, $\alpha_3$, $\alpha_4$ for a particular y are determined by:

$$\alpha_1 = \left(\frac{d_H - l_H}{d_H}\right) \cdot \left(\frac{d_V - l_V}{d_V}\right) \gamma_0 - \gamma_1$$

$$\alpha_2 = \frac{l_H}{d_H} \frac{d_V - l_V}{d_V} \gamma_0 - \gamma_1$$

$$\alpha_3 = \left(\frac{d_H - l_H}{d_H}\right) \cdot \frac{l_V}{d_V} \gamma_0 - \gamma_1$$

$$\alpha_4 = \frac{l_H}{d_H} \frac{l_V}{d_V} \gamma_0 - \gamma_1$$

where:

$$\gamma_0 = \left\{ (\beta^2 \cdot \tfrac{1}{4}) / \left[ \left(\frac{l_H}{d_H} \cdot \tfrac{1}{2}\right)^2 + \right. \right.$$
$$\left. \left. \left(\frac{l_V}{d_V} \cdot \tfrac{1}{2}\right)^2 + 4\left(\frac{l_H}{d_H} \cdot \tfrac{1}{2}\right)^2 \left(\frac{l_V}{d_V} \cdot \tfrac{1}{2}\right)^2 \right] \right\}^{\tfrac{1}{2}}$$

$$\gamma_1 = \tfrac{1}{4}(\gamma_0 \cdot 1), \tfrac{1}{2} \geq \beta^2 > \tfrac{1}{4}$$

and $d_H$ and $d_V$ are the dimensions of a said group of four pixels.

5. A process as in claim 1 where said noise portion of said signal is identical but independently distributed noise.

6. An image restoration process for correcting the warped reconstructed image produced by a magnetic resonance imaging (MRI) method where by determining the inhomogeneities of the magnetic field used in the MRI method corrected pixel locations for a corrected image are calculated, each such pixel location having a known offset, $1_V$, $1_H$, from a group of "n" pixels ($x_1$, $x_2$, $x_3$, $x_n$) of the reconstructed warped image, each of said pixels having a known intensity value including a signal portion and a noise portion, said restoration process interpolating said pixel values to determine an intensity value for said corrected pixel location comprising the following steps:

for each corrected pixel location, y, computing the corresponding intensity value using $$y = \sum_{i=1}^{n} \alpha_i x_i$$

where $\alpha_i$ is the relative weight to be given each $x_i$ in computing said intensity value of y, by determining $\alpha_1, \alpha_2, \alpha_3, \ldots \alpha_n$ within the following constraints and taking into account said offset:

$$\alpha_i \geq 0 \quad i = 1, 2, 3, \ldots n \qquad \text{I.}$$

$$\sum_{i=1}^{n} \alpha_i = 1 \qquad \text{II.}$$

$$\sum_{i=1}^{n} \alpha_i^2 = \beta^2 < 1 \qquad \text{III.}$$

where $\beta^2$ is substantially a constant and whereby noise variance of said noise portion is uniform for each corrected pixel location and is independent of location of each pixel within said group of pixels; and displaying or storing said computed intensity values for each corrected pixel location to provide a said restored image.

7. A process as in claims 1 or 6 including the following steps for sharpening said restored image:
forming the complex Fourier transform of said restored image;
forming a product by multiplying the above said transform by an inverse SINC function in the Fourier domain to filter said image;
inverse transforming said product to form a sharpened image in the spatial domain.

8. An image restoration process for correcting a warped reconstructed image made up of image points produced by a magnetic resonance imaging (MRI) method;
interpolating said image points to provide a restored image;
forming the complex Fourier transform of said restored image;
forming a product by multiplying the above said transform by an inverse SINC function in the Fourier domain to filter said image;
inverse transforming said product to form a sharpened image in the spatial domain.

9. A process as in claim 8 including the steps of:
in said multiplying step utilizing a fast convolution technique of the circular or periodic type;
saving the border regions of said restored image;
utilizing said inverse SINC function in a spatial domain to filter said border regions; and
forming a composite image in the spatial so main using said inverse transformed sharpened image for the central portion of said composite image and said filtered border regions for the borders of said composite image.

10. A process as in claim 8 where said inverse SINC function is mollified.

11. A process as in claim 10 where said mollified inverse SINC function is of the form $$\frac{e^{-\alpha(f_x^2 + f_y^2)}}{\text{SINC}^4(f_x B)\text{SINC}^4(f_y B)}$$

where B is a fixed constant depending on pixel to pixel spacing of said image and $\alpha$ determines the degree of mollification.

12. A process as in claim 11 including the step of adjusting "$\alpha$" in accordance with ambient noise.

13. A process as in claim 8 where said inverse SINC function is truncated.

14. A process in claim 9 including the steps of rescaling said composite image and replacing any negative values with zero.

15. A process as in claim 9 including the following steps for forming said inverse SINC function:
forming said function in mollified form as $$\frac{e^{-\alpha(f_x^2 + f_y^2)}}{\text{SINC}^4(f_x B)\text{SINC}^4(f_y B)}$$

where B is a fixed constant depending on pixel to pixel spacing of said image and $\alpha$ determines the degree of mollification;
taking a discrete inverse Fourier transform of said function to form a function in the spatial domain;
truncating said spatial domain function;
Fourier transforming said truncated spatial domain function;
and storing both said Fourier and spatial domain functions.

16. A process as in claim 6 where n is equal to 16 and where a "cubic B spline" type of interpolation is made and where $\beta$ of Equation III is substantially constant between 0.46 and 0.50.

* * * * *